(12) United States Patent
Smith et al.

(10) Patent No.: US 7,719,368 B1
(45) Date of Patent: May 18, 2010

(54) CONFIGURABLE RESET CIRCUIT FOR A PHASE-LOCKED LOOP

(75) Inventors: Paul Jeffrey Smith, Colorado Springs, CO (US); Travis A. Bradfield, Colorado Springs, CO (US); Jeffrey K. Whitt, Colorado Springs, CO (US)

(73) Assignee: Agere Systems Inc., Allentown, PA (US)

( * ) Notice: Subject to any disclaimer, the term of this patent is extended or adjusted under 35 U.S.C. 154(b) by 41 days.

(21) Appl. No.: 12/273,913

(22) Filed: Nov. 19, 2008

(51) Int. Cl.
*H03L 7/095* (2006.01)
(52) U.S. Cl. .................. 331/25; 331/173; 331/DIG. 2
(58) Field of Classification Search .............. 331/1 A, 331/8, 14, 16–18, 25, 173, DIG. 2
See application file for complete search history.

(56) References Cited

U.S. PATENT DOCUMENTS

| 5,436,597 A | * | 7/1995 | Dunlap et al. ............... 331/1 A |
| 5,864,572 A | | 1/1999 | Bhagwan |

\* cited by examiner

*Primary Examiner*—David Mis
(74) *Attorney, Agent, or Firm*—Ryan, Mason & Lewis, LLP

(57) ABSTRACT

A method of eliminating a runaway condition in a PLL includes the steps of: determining whether the PLL is locked to an input reference signal; when the PLL is not locked to the input reference signal, determining whether a frequency of an output signal generated by the PLL exceeds a prescribed maximum frequency; and when the frequency of the output signal generated by the PLL exceeds the prescribed maximum frequency, resetting the PLL to thereby eliminate the runaway condition.

21 Claims, 2 Drawing Sheets

100

200

400

300

CONFIGURABLE RESET CIRCUIT FOR A PHASE-LOCKED LOOP

FIELD OF THE INVENTION

The present invention relates generally to the electrical and electronic arts, and more particularly relates to phased-locked loop (PLL) circuits.

BACKGROUND OF THE INVENTION

A PLL is a well-known frequency-selective feedback control system which is adapted to generate a signal that can synchronize with a reference input signal and closely track the frequency changes which may be associated with the input signal. PLLs are utilized in numerous applications, including, for example, communication, telemetry and data-recovery systems.

The range of frequencies over which the PLL can maintain synchronization with an input signal is typically defined as the tracking range, or lock range, of the system. This is different from the range of frequencies over which the PLL can first synchronize with the incoming signal, the latter range of frequencies being typically known as the capture range, or acquisition range, of the PLL. The capture range is characteristically always smaller than the tracking range in practical PLL circuits. Generally, the larger the tracking range of the PLL, the worse is the performance of the PLL. Ideally, a narrow tracking range is desirable in order to rapidly capture the input signal and to hold the frequency of the input signal more precisely while in lock. However, a narrow tracking range does not allow the PLL to maintain synchronization with the incoming signal over fluctuations in the frequency of the incoming signal, in addition to variations in operating conditions and/or manufacturing characteristics to which the PLL may be subjected, such as, for example, process, voltage supply and/or temperature (PVT).

A problem exists in the use of PLL circuits for certain applications, such as, for example, frequency multiplication, wherein the PLL output overshoots the targeted operating frequency and comes out of lock. This phenomenon, in which the PLL output frequency increases unrestrained to its maximum possible value, is often referred to as runaway. In a runaway condition, the PLL essentially never re-acquires lock to the reference input signal. Conventional solutions to eliminate or avoid runaway have generally involved monitoring a control voltage generated by a charge pump circuit in the PLL and comparing this voltage to the PLL supply voltage. Under a runaway condition, the charge pump control voltage will exceed the PLL supply voltage by some detectable amount and will cause the comparator to generate a runaway detect signal indicative of the presence of the runaway condition. This runaway detect signal is then used to re-initialize the PLL in an attempt to lock to the reference input signal.

Since a false runaway detection may cause catastrophic data loss, a conservative approach is typically employed to set the failing threshold as high as possible. Unfortunately, over a range of PVT variations to which the PLL may be subjected, when this threshold for detecting a runaway condition is set too high, there is a significant risk that the occurrence of a runaway condition will never be detected.

Accordingly, there exists a need for a PLL circuit which does not suffer from one or more of the above-described problems associated with conventional PLL circuits.

SUMMARY OF THE INVENTION

Illustrative embodiments of the present invention meet the above-noted need by providing circuits, methods and techniques for advantageously detecting and advantageously eliminating the occurrence of runaway in a PLL, particularly over variations in PVT conditions to which the PLL may be subjected.

In accordance with one aspect of the invention, a method of eliminating a runaway condition in a PLL includes the steps of: determining whether the PLL is locked to an input reference signal; when the PLL is not locked to the input reference signal, determining whether a frequency of an output signal generated by the PLL exceeds a prescribed maximum frequency; and when the frequency of the output signal generated by the PLL exceeds the prescribed maximum frequency, resetting the PLL to thereby eliminate the runaway condition.

In accordance with another aspect of the invention, a circuit for eliminating a runaway condition in a PLL includes a detector and at least one controller coupled to the detector. The detector is operative to receive a signal representative of an output signal of the PLL and to generate a signal indicative of a difference between a prescribed maximum frequency and a frequency of the signal representative of an output signal of the PLL. The controller is operative: to determine whether the PLL is locked to an input reference signal; when the PLL is not locked to the input reference signal, to determine whether the frequency of the signal representative of an output signal of the PLL exceeds the prescribed maximum frequency; and, when the frequency of the signal representative of an output signal of the PLL exceeds the prescribed maximum frequency, to reset the PLL to thereby eliminate the runaway condition.

In accordance with yet another aspect of the invention, an electronic system includes a PLL operative to receive an input reference signal and to generate an output signal having a frequency which substantially tracks a frequency of the input reference signal, and a configurable reset circuit coupled to the PLL and operative to eliminate a runaway condition in the PLL. The circuit includes a detector operative to receive a signal representative of an output signal of the PLL and to generate a signal indicative of a difference between a prescribed maximum frequency and a frequency of the signal representative of an output signal of the PLL. The circuit further includes at least one controller coupled to the detector. The controller is operative: to determine whether the PLL is locked to an input reference signal; when the PLL is not locked to the input reference signal, to determine whether the frequency of the signal representative of an output signal of the PLL exceeds the prescribed maximum frequency; and, when the frequency of the signal representative of an output signal of the PLL exceeds the prescribed maximum frequency, to reset the PLL to thereby eliminate the runaway condition.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative PLL circuit. It is to be appreciated, however, that the techniques of the present invention are not limited to the specific circuit shown and described herein. Rather, embodiments of the invention are directed broadly to improved techniques for detecting and eliminating runaway in a PLL circuit. For this reason, numerous modifications can be made to these embodiments and the results will still be within the scope of the invention. No limitations with respect to the specific embodiments described herein are intended or should be inferred.

Figure 1:
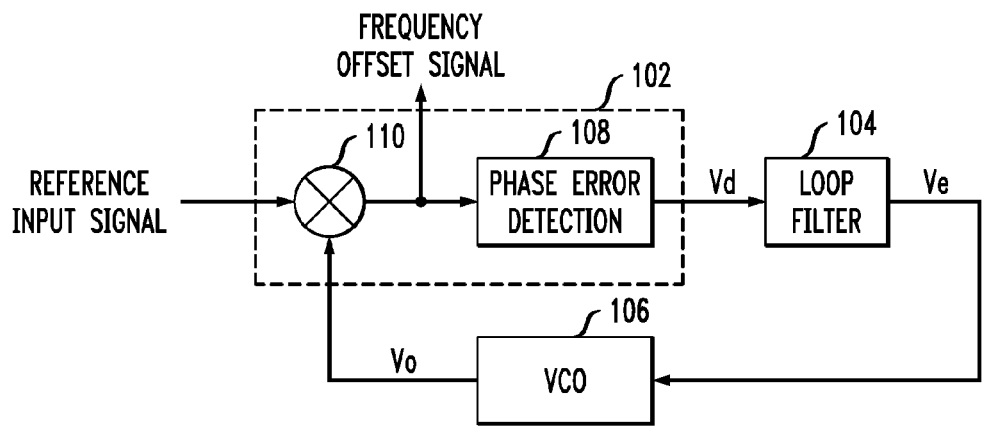
FIG. 1 is a block diagram depicting an illustrative PLL circuit in which techniques of the present invention may be implemented.

FIG. 1 is a block diagram depicting an exemplary PLL 100 in which techniques of the present invention may be implemented. The basic functional blocks of PLL 100 include a phase detector 102, or an alternative phase-frequency comparator, a loop filter 104 (e.g., low-pass filter, band-pass filter, etc.), and a voltage controlled oscillator (VCO) 106, or alternative controllable oscillator (e.g., variable frequency oscillator (VFO), numeric controlled oscillator (NCO), etc.), interconnected to form a closed loop feedback system, as shown. Phase detector 102 may be implemented by a phase error detection circuit 108 having an input connected to an output of a mixer 110, which in turn operatively combines a reference input signal with an output signal, Vo, generated by VCO 106. The signal generated at the output of mixer 110 may be considered a frequency offset compensated signal. Alternative phase and/or frequency detection circuitry is similarly contemplated.

Phase detector 102 is operative to compare the phase of a periodic reference input signal with a frequency of the output signal Vo generated by the VCO 106 and to generate an error signal, which may be error voltage, Vd, as a function thereof. In this embodiment, it is assumed that the input signal has already been down-converted to base band, although this is not a requirement of the invention. The error voltage Vd is then filtered by loop filter 104 and is applied to a control input of VCO 106 in the form of a filtered error signal, which may be a filtered error voltage, Ve, to control the frequency of the output signal Vo generated by the VCO.

Normally, with no input signal applied to PLL 100, the filtered error voltage Ve in the feedback loop will be substantially equal to zero. This is generally referred to as a free-running condition of the PLL, where the VCO 106 operates at a steady-state frequency equal to a free-running frequency, $f_0$, of the VCO. When a periodic input signal is applied to PLL 100 that is sufficiently close in frequency to the free-running frequency $f_0$ of VCO 106, the feedback nature of the PLL will cause a non-zero error voltage Vd to be generated, thereby forcing the VCO to synchronize with the frequency of the input signal. When this occurs, PLL 100 is said to be locked on the input signal frequency (i.e., a lock state).

When PLL 100 is locked, the frequency of the output signal generated by VCO 106 will be substantially identical to the frequency of the input signal, except for a finite phase difference indicative of a frequency offset between the input signal applied to the PLL and the output signal generated by the VCO. This frequency offset may be due to, for example, frequency offset in the VCO, Doppler frequency shift, etc. The VCO output signal may therefore be considered to be an estimated frequency offset. This finite phase difference, often referred to as phase error, is necessary in order to generate the filtered error voltage Ve and thus maintain lock.

While in lock condition, PLL 100 is preferably able to track small variations in the frequency of the input signal. The magnitude of the filtered error voltage Ve necessary to maintain lock will be a function of (e.g., proportional to) a frequency shift of the input signal, relative to the free-running frequency $f_0$ of VCO 106. While the PLL is tracking an input signal, the error voltage Ve will be indicative of the frequency difference between the input signal and the VCO free-running frequency $f_0$. As previously stated, the tracking range of a PLL may be defined as that range of frequencies, centered about the free-running frequency $f_0$ of the VCO, over which the PLL can track a given input signal once the PLL is locked. The free-running frequency $f_0$ of VCO 106 predominantly determines the nominal center frequency of the capture and lock ranges. Therefore, the accuracy and stability of the VCO are important.

Since the corrective error voltage Ve generated by loop filter 104 is limited to a prescribed range of voltage and/or current (e.g., voltage supply rails of the PLL), the amount of control over the phase and/or frequency of VCO 106 will also be limited. Thus, most PLLs have a limited tracking range, which may be referred to herein as a tracking window, within which the PLLs can track frequency variations of the input signal. The range of the error voltage Ve can be extended by adding gain to the feedback loop, although this range is generally limited to the voltage supply rails of the PLL circuit.

Once the PLL becomes unlocked, the PLL must be synchronized with the input signal again, also referred to as capturing or acquiring the input signal. A signal capturing procedure can take a considerable amount of time to perform, and therefore it is desirable to avoid having the PLL become unlocked. As previously stated, the capture range of a PLL is the range of frequencies over which the PLL can initially synchronize with the incoming signal. Since loop filter 104 functions, at least in part, to attenuate high-frequency components of the error voltage Vd in the PLL 100, the loop filter has a dominant effect on the capture and transient response characteristics of the PLL system. In order to improve performance in the PLL system, such as, for example, to improve interference rejection characteristics of the system, it is desirable to design the loop filter 104 to have a relatively narrow bandwidth. Unfortunately, however, the capture range of the PLL decreases as the loop filter bandwidth is reduced.

With regard to transient response of the PLL, it is often desirable for the PLL to exhibit a fast response time so as to reduce the amount of time the PLL requires to achieve lock and to better track the reference input signal. However, there is an increased risk that the PLL output will overshoot the targeted operating frequency and come out of lock. As previously stated, this phenomenon, in which the PLL output frequency increases unrestrained to its maximum possible value, is referred to as runaway. A PLL in a runaway state essentially never re-acquires lock and essentially must be re-initialized, such as, for example, by way of a reset signal applied to the PLL (or an alternative initialization process).

Figure 2:
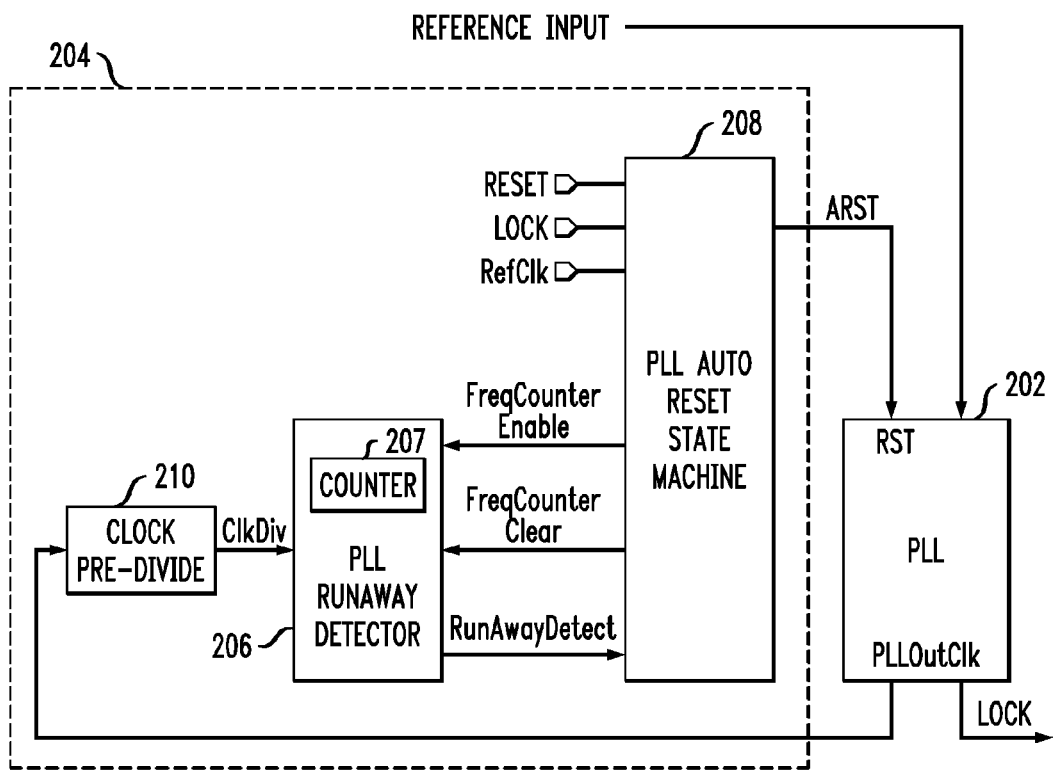
FIG. 2 is a block diagram depicting an exemplary PLL circuit, formed in accordance with an embodiment of the present invention.

FIG. 2 is a block diagram depicting an exemplary PLL circuit 200, formed in accordance with an embodiment of the present invention. PLL circuit 200 preferably comprises a PLL 202 and a configurable reset circuit 204 operatively coupled to the PLL. PLL 202 may be formed having an architecture consistent with the illustrative PLL 100 shown in FIG. 1, although alternative PLL architectures are similarly contemplated. PLL 202 preferably receives an input reference signal, which may be a reference clock (RefClk) or a signal representative thereof, and generates an output signal, PLLOutClk, having a frequency which is a function of, and preferably tracks, the reference input signal. The PLL output signal may be an output of a VCO (e.g., VCO 106 in FIG. 1) included in the PLL 202, or a signal indicative thereof, such a multiplied or divided version of the VCO output. PLL 202 also includes a reset input (RST) adapted to receive a reset signal (e.g., ARST) which, when asserted, is operative to initialize the PLL to a known operating state. For instance, upon receiving an active reset signal, PLL 202 may set a frequency of the output signal PLLOutClk to a prescribed minimum value.

As stated above, certain conditions (e.g., variations in one or more PVT parameters of the PLL) may cause the PLL 202 to come out of lock and enter into a runaway state, wherein the PLL is not able to re-acquire lock. When this occurs, the PLL 202 must be re-initialized, such as by asserting reset signal ARST. Since resetting the PLL may cause catastrophic system failure and/or data loss, which is undesirable, an accurate and reliable means for detecting when the PLL is in a runaway state, as opposed to a false runaway indication, is beneficial. Moreover, the runaway detection methodology should not issue a false runaway indication, and therefore inadvertently reset the PLL, over a prescribed range of PVT variations in which the PLL is designed to operate. In order to accomplish this, reset circuit 204 preferably includes a PLL runaway detector 206 and a PLL auto reset state machine 208, or an alternative controller, coupled to the detector. Operation of reset circuit 204 will now be described in further detail below.

Reset circuit 204 preferably receives, as inputs, a Reset signal, which may be a system reset signal used for device initialization (e.g., power-on reset (POR)), an input reference signal, RefClk, or a signal representative thereof (e.g., a multiplied or divided version of RefClk), which may be a system input clock supplied to the circuit, a Lock signal, indicating that the PLL 202 has locked to the reference signal RefClk, and the output signal PLLOutClk generated by the PLL. Reset circuit 204 preferably generates, as an output, an automatic reset signal, ARST, which is supplied to the PLL 202 for resetting the PLL when a runaway condition is detected in the PLL.

PLL auto reset state machine 208 includes a first control input adapted for receiving the reset signal (Reset), a second control input adapted for receiving the reference signal RefClk, or a signal representative thereof, and a third control input adapted for receiving the Lock signal indicating whether or not the PLL 202 is locked to the reference signal RefClk. State machine 208 further receives a runaway detect signal, generated by PLL runaway detector 206, which is indicative of the presence of a runaway condition in the PLL 202. State machine 208 is preferably operative to determine whether or not the PLL 202 is locked to the input reference signal RefClk (e.g., as a function of the Lock signal). When the PLL 202 is not locked, state machine 208 is further operative to determine whether or not a frequency of the output signal PLLOutClk exceeds a prescribed threshold value indicative of a runaway condition, and, when the output frequency of the PLL exceeds the prescribed threshold value, to reset the PLL and thereby eliminate the runaway condition.

Figure 3:
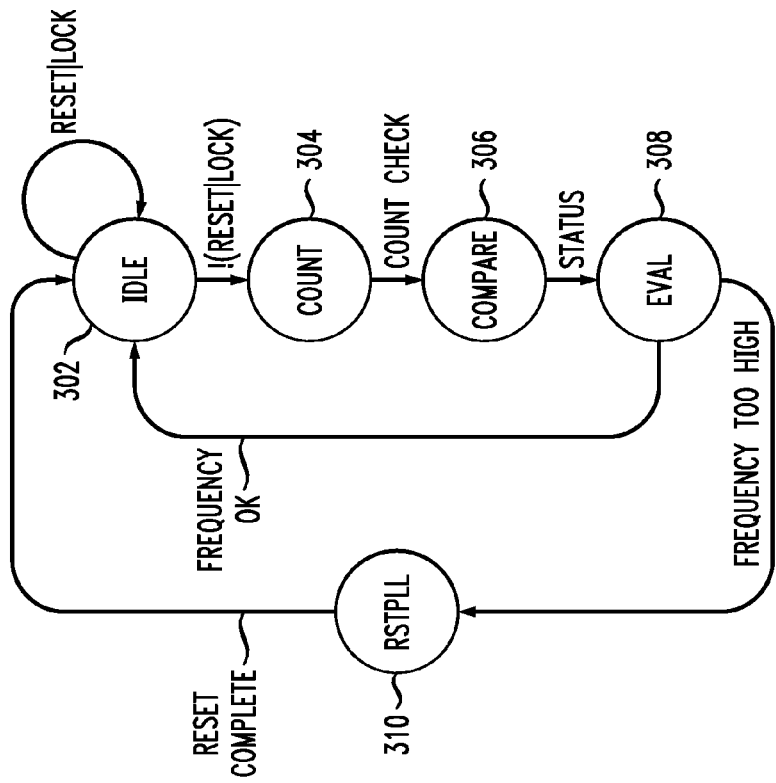
FIG. 3 is a state diagram depicting an exemplary reset operation which may be implemented in the PLL circuit shown in FIG. 2, in accordance with an embodiment of the present invention.

More particularly, FIG. 3 is a state diagram depicting an exemplary reset methodology 300 which may be implemented in one of more functional blocks of the configurable reset circuit 204 shown in FIG. 2, according to an embodiment of the invention. Reset methodology 300 preferably comprises an idle state (IDLE) 302, a counting state (COUNT) 304, a compare state (COMPARE) 306, an evaluation state (EVAL) 308 and a reset state (RSTPLL) 310. Preferably, the reset methodology 300 remains in the idle state 302 when the PLL is either locked to the input reference signal RefClk or when there is a reset condition. A reset condition may be initiated at the system level, such as, for example, when the Reset signal applied to state machine 208 is asserted (e.g., during a system POR). Alternatively, a reset condition may be initiated, for example, by the state machine itself, such as when a particular reset event is detected. Thus, as long as at least one of these conditions is present (e.g., PLL locked or Reset asserted), the state machine will remain in the idle state 302.

When the reset condition is removed (e.g., when Reset signal is de-asserted) and the PLL goes out of lock, the state machine advances to the counting state 304. Although the PLL has gone out of lock, this does not necessarily imply a runaway condition is present. The PLL, in the normal course of operation, may become unlocked from the input reference signal, but will then typically re-acquire the reference signal on its own. Thus, in counting state 304, a frequency of the output signal generated by the PLL is measured and a count value, CountCheck, is returned which is indicative thereof.

With continued reference to FIG. 2, in order to measure the frequency of the output signal PLLOutClk generated by PLL 202 in the counting state, state machine 208 preferably enables a counter 207 included in detector 206 to begin counting for a prescribed interval of time (e.g., frequency measurement interval). Counter 207 may comprise, for example, a standard binary counter (e.g., asynchronous or synchronous counter, D flip-flop, adder, etc.), and the counting may involve either incrementing or decrementing an output count value by one or more steps (e.g., counts) per clock cycle. The resulting output count value at the completion of the prescribed interval of time will be directly representative of the frequency of the PLL output signal PLLOutClk. This approach of directly measuring the frequency of the PLL output signal advantageously eliminates the need to measure an analog voltage representative of PLL output frequency, which can be undesirably affected by PVT variations. State machine 208 asserts a counter enable signal, FreqCounterEnable, or alternative control signal, supplied to the detector 206 to initiate a given frequency measurement interval. Counter 207 preferably receives, as an input clock, the PLL output signal PLLOutClk. Once the counter enable signal is asserted, it preferably remains asserted for a prescribed period of time, such as, for example, one millisecond. This can be accomplished, for example, using another counter which is clocked by RefClk, or an alternative timing circuit. Thus, the frequency measurement interval is preferably defined by the assertion and subsequent de-assertion of the counter enable signal. It is to be understood that the invention is not limited to any particular duration of the frequency measurement interval. In order to lessen the burden on the counter or related frequency measurement circuitry, particularly when the PLL output is running at a high frequency (e.g., greater than about one gigahertz), a clock pre-divider 210 may be optionally employed. The output of pre-divider 210, ClkDiv, which will be a divided version of the PLL output PLLOutClk, is then supplied to detector 206 to be used as the input clock signal to the counter 207. Counter 207 is initially set to a predetermined count value, preferably zero, such as via a clear signal, FreqCounterClear, or an alternative reset signal, received from state machine 208. The counter 207 can be initialized to begin counting at essentially any count value and is operative to increment (or decrement) the count value in response to the input clock signal ClkDiv. For example, counter 207 is preferably operative to increment its count value by one every cycle of the input clock ClkDiv. The counter 207 is preferably reset at the beginning of each frequency measurement interval. At the completion of the measurement interval, the frequency of the PLL output signal PLLOutClk may be determined by taking a difference between the start and ending count values of counter 207 and dividing this difference by the prescribed time interval.

According to other aspects of the invention, the frequency measurement interval may be selectively controlled as a function of one or more control signals supplied to detector 206. In one embodiment, the duration of the measurement interval may be stored in a register in state machine 208. Likewise, the divide value used by clock pre-divider 210 may be selectively controlled as a function of at least one control signal supplied thereto. In another embodiment of the invention, the divide value may be stored in a register in divider 210.

With reference again to FIG. 3, the completion of the prescribed time interval in counting state 304 (e.g., de-assertion of the FreqCounterEnable signal) causes the reset methodology 300 to advance to compare state 306. In the compare state 306, the output count value CountCheck generated in counting state 304 is compared with a prescribed threshold value indicative of a desired maximum frequency of the output signal PLLOutClk generated by the PLL. In accordance with other embodiments of the invention, the prescribed threshold value to which the output count value is compared, is selectively controllable (i.e., programmable) as a function of one or more control signals. A programmable threshold value beneficially provides control of the sensitivity of runaway detection. For example, a programmable threshold feature provides earlier detection of a runaway condition by allowing the detection frequency to be set closer to a normal operating frequency of the PLL.

After comparing the count value CountCheck with the prescribed threshold value, the result of the comparison, Status, is evaluated in evaluation state 308. When CountCheck is less than or equal to the prescribed threshold value, which is indicative of the frequency of the output signal generated by the PLL being less than the desired maximum frequency (e.g., Freq. OK), the reset methodology 300 returns to the idle state 302. Alternatively, when CountCheck exceeds the prescribed threshold value, which is indicative of the frequency of the output signal of the PLL exceeding the desired maximum frequency, implying that a runaway condition may exist, reset methodology 300 advances to the reset state 310. In reset state 310, the PLL is reset, such as, for example, by asserting a reset signal ARST supplied to the PLL. Resetting the PLL may comprise setting the PLL to a prescribed minimum frequency, at which point the PLL will slowly increase the frequency of the output signal in an attempt to re-acquire lock. After resetting the PLL, the reset methodology 300 returns to the idle state 302.

The reset signal (e.g., ARST in FIG. 2) used to reset the PLL may comprise a pulse width that is selectively adjustable as a function of one or more control signals, in accordance with an aspect of the invention. In this regard, reset circuit 204 shown in FIG. 2 may be considered a programmable reset circuit. For example, the pulse width of the reset signal may be controlled as a function of a prescribed value stored in a register in state machine 208. Alternatively, the pulse width of the reset signal may be controlled as a function of at least one PVT parameter of the PLL circuit (e.g., PLL circuit 200 of FIG. 2). In either case, a duration of the reset signal is preferably set so as to insure essentially complete re-initialization of the PLL in the case of runaway detection.

Figure 4:
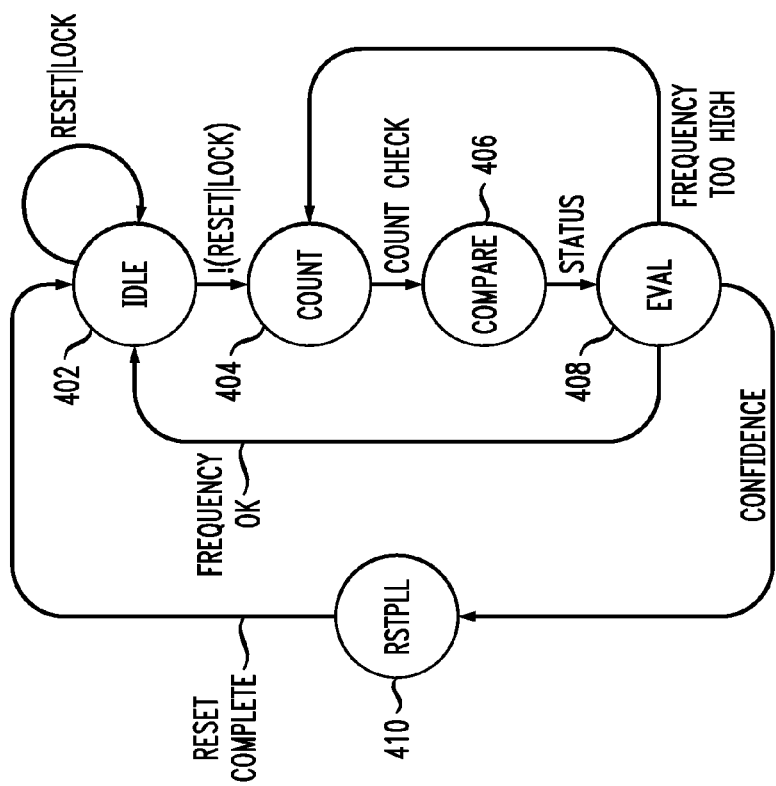
FIG. 4 is a state diagram depicting an exemplary reset operation which may be implemented in the PLL circuit shown in FIG. 2, in accordance with another embodiment of the present invention.

FIG. 4 is a state diagram depicting an exemplary reset operation 400 which may be implemented in the PLL circuit shown in FIG. 2, in accordance with another embodiment of the invention. Like reset methodology 300 shown in FIG. 3, reset methodology 400 includes five states, namely, an idle state (IDEL) 402, a counting state (COUNT) 404, a comparison state (COMPARE) 406, an evaluation state (EVAL) 408 and a reset state (RSTPLL) 410. Preferably, the reset methodology 400 remains in the idle state 402 when the PLL is either locked to the input reference signal RefClk or when there is a reset condition (Reset|Lock). As previously explained, a reset condition may be initiated at the system level, such as, for example, when the Reset signal applied to state machine 208 is asserted (e.g., POR). Alternatively, a reset condition may be initiated, for example, by the state machine itself, such as when a particular reset event is detected. Thus, as long as at least one of these conditions is present (e.g., PLL locked or Reset asserted), the state machine will remain in the idle state 402.

When both the reset condition is removed (e.g., when Reset signal is de-asserted) and when the PLL goes out of lock (!(Reset|Lock)), the state machine advances to the counting state 404. In counting state 404, a frequency of the output signal (e.g., PLLOutClk in FIG. 2) generated by the PLL is measured and a count value, CountCheck, is returned which is indicative thereof. The count value may be generated as an output from a binary counter (e.g., counter 207 in FIG. 2) enabled by a control signal (e.g., FreqCounterEnable in FIG. 2) and operative to increment its output count with each cycle of the PLL output signal, or a signal representative thereof, as previously described. Completion of the prescribed time interval in counting state 404 (e.g., de-assertion of the FreqCounterEnable signal) causes the reset methodology 400 to advance to the compare state 406.

In compare state 406, the output count value CountCheck generated in counting state 404 is compared with a prescribed threshold value indicative of a desired maximum frequency of the output signal PLLOutClk generated by the PLL. In embodiments of the invention, the prescribed threshold value to which the output count value is compared is programmable as a function of one or more control signals. A programmable threshold value beneficially provides control of the sensitivity of the runaway condition detection, as stated above.

After comparing the count value CountCheck with the prescribed threshold value, the result of the comparison, Status, is evaluated in evaluation state 408. In a manner similar to reset methodology 300 described in conjunction with FIG. 3, when CountCheck is less than or equal to the prescribed threshold value, which is indicative of the frequency of the output signal generated by the PLL being less than the desired maximum frequency (e.g., Freq. OK), the reset methodology 400 returns to the idle state 402. Alternatively, when CountCheck exceeds the prescribed threshold value, which is indicative of the frequency of the PLL output signal PLLOut- Clk exceeding the desired maximum frequency, rather than resetting the PLL, as in methodology 300 depicted in FIG. 3, reset methodology 400 preferably returns to counting state 404, where the frequency of the PLL output signal PLLOut-Clk is re-checked an additional one or more times. In this manner, reset methodology 400 provides a means of advantageously enhancing a confidence of the runaway condition detection, so as to minimize false detections of a runaway condition in the PLL.

More particularly, when it is determined in state 408 that the output count value CountCheck exceeds the prescribed threshold value, a loop counter operative to track the number of consecutive times methodology 400 has detected a runaway condition in the PLL, is preferably evaluated. Here, it is assumed that the loop counter has been previously initialized (e.g., set to zero or an alternative initial value) before advancing to state 404 from idle state 402. Preferably, the loop counter is cleared when idle state 402 is entered. If the loop counter has not exceeded a prescribed maximum value, Confidence, indicative of a desired number of consecutive times a runaway condition is detected, the frequency counter (e.g., 207) is preferably cleared, such as by asserting the FreqCounterClear signal (see FIG. 2), and the reset methodology returns to state 404 to begin frequency measurement and evaluation of the PLL output signal PLLOutClk.

When the Status generated in state 406 indicates that CountCheck is less than or equal to the prescribed threshold value, which is indicative of the frequency of the output signal generated by the PLL being less than the desired maximum frequency (e.g., Freq. OK), the reset methodology 400 returns to the idle state 402. In this instance, the previous runaway condition detection can be assumed to have been false, otherwise the runaway condition would still exist after subsequent frequency measurement processes. Alternatively, when CountCheck exceeds the prescribed threshold value, which is indicative of the frequency of the PLL output signal PLLOut-Clk exceeding the desired maximum frequency, the loop counter is incremented and then checked to determine whether the maximum number of consecutive runaway condition detections has been reached. In an illustrative embodiment, reset methodology 400 requires detection of a runaway condition three consecutive times before resetting the PLL. It is to be understood, however, that the invention is not limited to any particular number of consecutive times a runaway condition is detected in the PLL.

Once the loop counter in evaluation state 408 has reached the prescribed maximum value Confidence, reset state 410 is entered. In reset state 410, the PLL is reset, such as, for example, by asserting a reset signal ARST supplied to the PLL. Resetting the PLL may comprise setting the PLL to a prescribed minimum frequency, at which point the PLL will slowly increase the frequency of the output signal in an attempt to re-acquire lock. The frequency and loop counters are preferably cleared in state 410, although such actions may be performed in an alternative state (e.g., idle state 402). After resetting the PLL, the reset methodology 400 returns to the idle state 402.

As in methodology 300 previously described in connection with FIG. 3, the reset signal (e.g., ARST in FIG. 2) used to reset the PLL may have a programmable pulse width. Specifically, the pulse width of the reset signal may be selectively adjustable as a function of one or more control signals. For example, according to aspects of the invention, the pulse width of the reset signal may be controlled as a function of a prescribed value stored in a register in state machine 208. Alternatively, the pulse width of the reset signal may be controlled as a function of at least one PVT parameter of the PLL circuit (e.g., PLL circuit 200 of FIG. 2). Regardless of the means used for controlling the reset signal, a duration of the reset signal is preferably selected so as to insure essentially complete re-initialization of the PLL in the case of runaway detection.

At least a portion of the techniques of the present invention may be implemented in one or more integrated circuits. In forming integrated circuits, die are typically fabricated in a repeated pattern on a surface of a semiconductor wafer. Individual die are cut or diced from the wafer, then packaged as integrated circuits. In packaging the dies, individual die are attached to a receiving substrate according to methods of the invention. One skilled in the art would know how to dice wafers to produce integrated circuits. Integrated circuits so manufactured are considered part of this invention.

An integrated circuit formed in accordance with interconnection techniques of the present invention can be employed in essentially any application and/or electronic system which includes a PLL. Suitable systems for implementing the invention may include, but are not limited to, communication networks, portable communications devices (e.g., cell phones), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of eliminating a runaway condition in a phase-locked loop (PLL), the method comprising the steps of:
   determining whether the PLL is locked to an input reference signal;
   when the PLL is not locked to the input reference signal, determining whether a frequency of an output signal generated by the PLL exceeds a prescribed maximum frequency; and
   when the frequency of the output signal generated by the PLL exceeds the prescribed maximum frequency, resetting the PLL to thereby eliminate the runaway condition.

2. The method of claim 1, wherein the step of determining whether the PLL is locked to the input reference signal comprises receiving a lock signal from the PLL, the lock signal being indicative of the frequency of the output signal generated by the PLL being within a prescribed range of frequency of the input reference signal.

3. The method of claim 1, wherein the step of determining whether a frequency of the output signal generated by the PLL exceeds the prescribed maximum frequency comprises counting a number of cycles of one of the output signal generated by the PLL and a signal representative of the output signal generated by the PLL during a prescribed period of time and comparing the number of cycles with a threshold count value representative of the prescribed maximum frequency.

4. The method of claim 3, wherein the step of counting the number of cycles of one of the output signal generated by the PLL and a signal representative of the output signal generated by the PLL is initiated by a control signal.

5. The method of claim 3, further comprising controlling a length of the prescribed period of time as a function of at least one of a process, a supply voltage, and a temperature of the PLL.

6. The method of claim 1, further comprising, when the frequency of the output signal generated by the PLL exceeds the prescribed maximum frequency, repeating the step of determining whether the frequency of the output signal exceeds the prescribed maximum frequency for a prescribed number of times and, if the frequency of the output signal generated by the PLL exceeds the prescribed maximum frequency each time the step of determining whether the frequency of the output signal exceeds the prescribed maximum frequency is performed, resetting the PLL.

7. The method of claim 6, wherein the number of times the step of determining whether the frequency of the output signal exceeds the prescribed maximum frequency is repeated is controllable as a function of at least one control signal.

8. The method of claim 1, further comprising, when the frequency of the output signal generated by the PLL exceeds the prescribed maximum frequency, repeating the step of determining whether the frequency of the output signal exceeds the prescribed maximum frequency for a prescribed number of times and, if the frequency of the output signal generated by the PLL exceeds the prescribed maximum frequency for a majority of the times the step of determining whether the frequency of the output signal exceeds the prescribed maximum frequency is performed, resetting the PLL.

9. The method of claim 1, wherein the step of determining whether the frequency of the output signal generated by the PLL exceeds the prescribed maximum frequency further comprises:
dividing the output signal generated by the PLL by a prescribed divide value so as to generate a divided reference signal;
counting a number of cycles of the divided reference signal during a prescribed period of time; and
comparing the number of cycles with a threshold count value representative of the prescribed maximum frequency, at least one of the prescribed period of time and the threshold count value being controlled as a function of the prescribed divide value.

10. The method of claim 1, wherein the step of resetting the PLL comprises setting the frequency of the output signal generated by the PLL to a prescribed minimum value.

11. The method of claim 1, wherein the step of resetting the PLL comprises generating a reset signal having a controllable pulse width.

12. The method of claim 11, wherein the pulse width of the reset signal is selectively adjustable during operation of the PLL.

13. The method of claim 11, wherein the pulse width of the reset signal is selectively adjustable as a function of at least one of a process, supply voltage and a temperature of the PLL.

14. A circuit for eliminating a runaway condition in a phase-locked loop (PLL), the circuit comprising:
a detector operative to receive a signal representative of an output signal of the PLL and to generate a signal indicative of a difference between a prescribed maximum frequency and a frequency of the signal representative of an output signal of the PLL; and
at least one controller coupled to the detector, the at least one controller being operative: to determine whether the PLL is locked to an input reference signal; when the PLL is not locked to the input reference signal, to determine whether the frequency of the signal representative of an output signal of the PLL exceeds the prescribed maximum frequency; and, when the frequency of the signal representative of an output signal of the PLL exceeds the prescribed maximum frequency, to reset the PLL to thereby eliminate the runaway condition.

15. The circuit of claim 14, wherein in order to determine whether the frequency of the output signal generated by the PLL exceeds the prescribed maximum frequency the at least one controller is further operative to count a number of cycles of one of the output signal generated by the PLL and a signal representative of the output signal generated by the PLL during a prescribed period of time and to compare the number of cycles with a threshold count value representative of the prescribed maximum frequency.

16. The circuit of claim 15, wherein the at least one controller is further operative to control a length of the prescribed period of time as a function of at least one of a process, a supply voltage, and a temperature of the PLL.

17. The circuit of claim 14, wherein when the frequency of the output signal generated by the PLL exceeds the prescribed maximum frequency, the at least one controller is further operative to repeat the step of determining whether the frequency of the output signal exceeds the prescribed maximum frequency for a prescribed number of times and, if the frequency of the output signal generated by the PLL exceeds the prescribed maximum frequency each time the step of determining whether the frequency of the output signal exceeds the prescribed maximum frequency is performed, to reset the PLL.

18. The circuit of claim 14, wherein when the frequency of the output signal generated by the PLL exceeds the prescribed maximum frequency, the at least one controller is further operative to repeat the step of determining whether the frequency of the output signal exceeds the prescribed maximum frequency for a prescribed number of times and, if the frequency of the output signal generated by the PLL exceeds the prescribed maximum frequency for a majority of the times the step of determining whether the frequency of the output signal exceeds the prescribed maximum frequency is performed, to reset the PLL.

19. The circuit of claim 14, wherein the at least one controller is further operative: to divide the output signal generated by the PLL by a prescribed divide value so as to generate a divided reference signal; to count a number of cycles of the divided reference signal during a prescribed period of time; and to compare the number of cycles with a threshold count value representative of the prescribed maximum frequency, at least one of the prescribed period of time and the threshold count value being controlled as a function of the prescribed divide value.

20. The circuit of claim 14, wherein the at least one controller is further operative to generate a reset signal having a controllable pulse width.

21. An electronic system, comprising:
a phase-locked loop (PLL) operative to receive an input reference signal and to generate an output signal having a frequency which substantially tracks a frequency of the input reference signal; and
a circuit coupled to the PLL and operative to eliminate a runaway condition in the PLL, the circuit comprising:
a detector operative to receive a signal representative of an output signal of the PLL and to generate a signal indicative of a difference between a prescribed maximum frequency and a frequency of the signal representative of an output signal of the PLL; and
at least one controller coupled to the detector, the at least one controller being operative: to determine whether the PLL is locked to an input reference signal;

when the PLL is not locked to the input reference signal, to determine whether the frequency of the signal representative of an output signal of the PLL exceeds the prescribed maximum frequency; and, when the frequency of the signal representative of an output signal of the PLL exceeds the prescribed maximum frequency, to reset the PLL to thereby eliminate the runaway condition.

* * * * *